United States Patent [19]

Sakamoto et al.

[11] Patent Number: 4,777,455
[45] Date of Patent: Oct. 11, 1988

[54] POWER SUPPLY CORD WITH A NOISE FILTER

[75] Inventors: Yukio Sakamoto; Kouichi Yamaguchi; Takayuki Hirotuji, all of Nagaokakyo, Japan

[73] Assignee: Murata Manufacturing Co. Ltd., Kyoto, Japan

[21] Appl. No.: 59,118

[22] Filed: Jun. 3, 1987

[30] Foreign Application Priority Data

Jun. 11, 1986 [JP] Japan .............................. 61-89851[U]

[51] Int. Cl.$^4$ ..................... H03H 7/01; H01R 13/66
[52] U.S. Cl. ........................................ 333/12; 174/32;
174/35 R; 333/181; 333/185
[58] Field of Search ................. 333/12, 167, 168, 181,
333/182, 183, 184, 185; 439/607, 620; 361/424;
174/32, 34, 35 R, 35 GC, 35 C

[56] References Cited

U.S. PATENT DOCUMENTS

| 2,186,578 | 1/1940 | Doughman | 333/181 |
| 4,611,185 | 9/1986 | Dirmeyer et al. | 333/167 |
| 4,614,924 | 9/1986 | Kamitz et al. | 333/185 X |

FOREIGN PATENT DOCUMENTS

| 146776 | 8/1936 | Fed. Rep. of Germany | 333/181 |
| 442099 | 2/1936 | United Kingdom | 333/181 |

OTHER PUBLICATIONS

Denes et al.—"Tiny Filters Block the Path of Radio Frequency Interference", Electronics, Oct. 31, 1966, pp. 58–67.

Primary Examiner—Marvin L. Nussbaum
Attorney, Agent, or Firm—Wenderoth, Lind & Ponack

[57] ABSTRACT

A power supply cord having a noise filter is used for connecting an electronic apparatus to a power source, the noise filter being mounted on the cord within 30 cm from the end thereof connected to the electronic apparatus of the noise generating source. Such a power supply cord is used even with an electronic apparatus that does not have a noise filter so that a countermeasure for noise is easily provided without the especially troublesome application of wiring within a shielding case for the electronic apparatus. Since the noise filter is positioned within 30 cm from the end of the power supply cord to be connected to the noise generating source, the power supply cord does not act as a radiation antenna for the noise band from the noise generating source so that the power supply cord eliminates noise from both ends effectively and has a superior filter characteristic.

3 Claims, 2 Drawing Sheets

POWER SUPPLY CORD WITH A NOISE FILTER

FIELD OF THE INVENTION

The present invention relates to a power supply cord with a noise filter, and more particularly to a power supply cord which connects an electronic apparatus of a noise generating source to a power source, which is a countermeasure for noise generated by the electronic apparatus and which does not act as a radiation antenna for the noise band of the noise generating source.

In order to prevent noise from going into and out of the electronic apparatus through a power supply cord, noise elimination means must be taken.

The conventional means for attaining the object described above is well-known, and for example, as shown in FIG. 6, includes an inlet type noise filter 2 mounted on one side surface of a shielding case 1 of an electronic apparatus and a power supply cord 3 connected to the noise filter 2. In FIG. 6, reference numeral 5 designates a receptacle at the power source side.

However, when the countermeasure for noise is taken in the completed electronic apparatus, the inlet type noise filter 2 must be mounted into the shielding case 1 and the requisite wirings must be applied therein, thereby complicating the mounting work of the filter 2 in the shielding case 1.

In order to eliminate such inconvenience, for example, as shown in FIG. 7, a noise filter 6 with a socket is plugged into the receptacle 5 at the power source side so that the socket of the noise filter 6 and an inlet socket 7 mounted on one side surface of the shielding case 1 for the electronic apparatus are connected by a power supply cord 3.

In such a conventional power supply cord, the noise emitted from the receptacle 5 at the power source side to the shielding case 1 is eliminated by the noise filter 6, but a problem remains in that noise emitted outwardly from the shielding case 1 through the power supply cord 3 is not eliminated because the cord 3 acts as a radiation antenna.

SUMMARY OF THE INVENTION

In light of the drawbacks of the prior art discussed above, the present invention has been designed. An object thereof is to provide a power supply cord with a noise filter, which is simple to mount and has a superior filter characteristic.

Another object of the present invention is to provide a power supply cord with a noise filter which does not act as a radiation antenna with respect to the noise band created by a noise generating source.

The above and other objects and features of the invention will appear more fully from a consideration of the following description taken in connection with the accompanying drawings.

DETAILED DESCRIPTION OF THE PREFERRED EMBODIMENT

Figure 1:
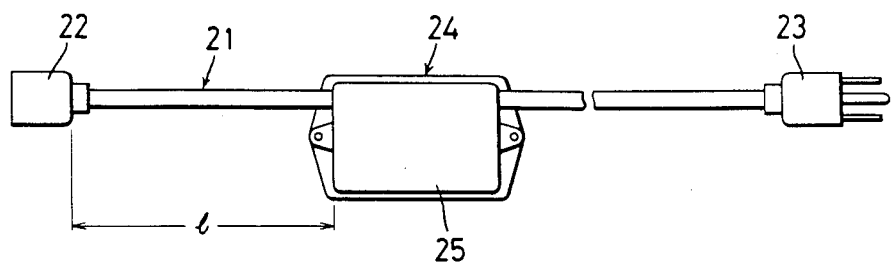
FIG. 1 is a plan view of an embodiment of a power supply cord with a noise filter of the invention.
Figure 2:
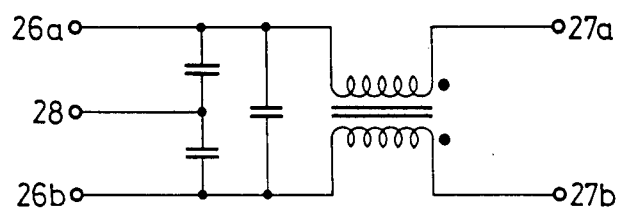
FIG. 2 is an equivalent circuit diagram of the noise filter in FIG. 1.

Referring to FIG. 1, reference numeral 21 designates a power supply cord. A connector 22 having a pair of input-output terminals and a ground terminal is mounted on one end of the cord 21 to be connected to the noise generating source and a plug 23 having a pair of input-output terminals and a ground terminal is mounted on the other end of the same to be connected to a power supply receptacle. Numeral 24 designates a noise filter mounted on the power supply cord 21 within about 10 to 30 cm from one end thereof, the noise filter 24 comprising a filter circuit unit which has an equivalent circuit as shown in FIG. 2 and is disposed in a shielding casing 25. The power supply cord 21 is connected to input-output terminals 26a, 26b and 27a, 27b of the filter circuit unit in the shielding casing 25, a ground terminal 28 being connected to the shielding casing 25.

Figure 3:
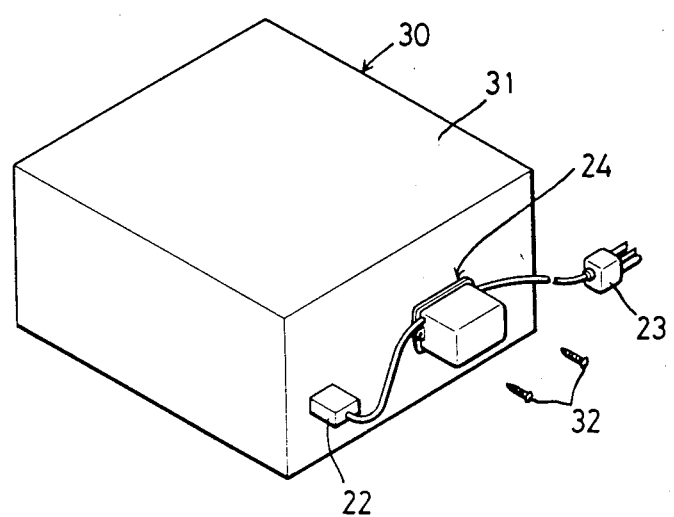
FIG. 3 is an illustration of the power supply cord with a noise filter in FIG. 1, mounted on an electronic apparatus.

The power supply cord with the noise filter of the invention constructed in the manner described above is used, for example, as shown in FIG. 3, in a manner in which the connector 22 is insertably mounted in an inlet socket (not shown) disposed at one surface of a shielding case 31 of an electronic apparatus 30, such as a digital apparatus acting as a noise generating source, the shielding casing 25 for the noise filter 24 abuts against one surface of the shielding case 31 of the electronic apparatus 30, the noise filter 24 is screwed to the one surface of the shielding case 31 by screws 32 or the like, and the plug 23 is mounted on a power supply receptacle (not shown) at the power source side.

The power supply cord with the noise filter of the invention used as described above has the noise filter 24 mounted on the power supply cord 21 within 30 cm from one end thereof, whereby the power supply cord 21 does not act as a radiation antenna with respect to a noise band up to about 300 MHz created by the electronic apparatus 30.

In other words, the noise radiated from the usual digital apparatus is under about 300 MHz and almost radiates from a cable connected to the apparatus, such as the power supply cord.

Figure 5:
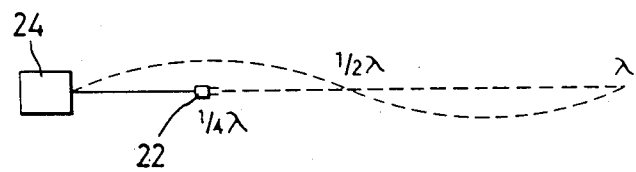
FIG. 5 is an illustration of the relation between the power supply cord and its action as an antenna.
Figure 6:
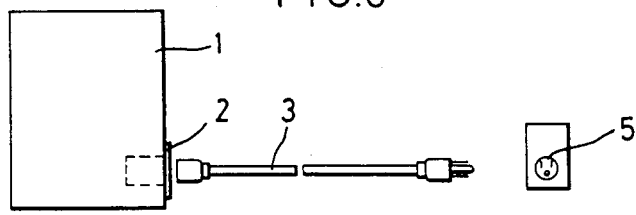
FIG. 6 is an illustration of an example of a countermeasure for noise comprising a conventional power supply cord.
Figure 7:
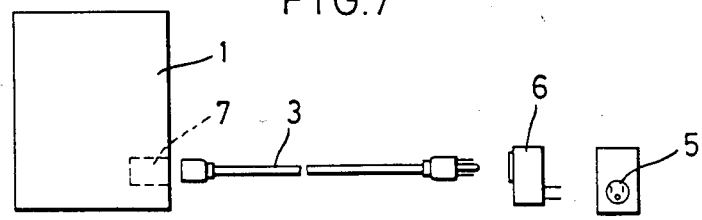
FIG. 7 is an illustration of another conventional example of a countermeasure for noise.

The frequency of the radiated noise and a length of the power supply cord have a predetermined relation as shown in FIG. 5.

More particularly, in the present invention, the power supply cord 21 is grounded at both ends of a length l of the cord extending between one end of the power supply cord 21 and the noise filter 24. The ground terminal of the connector 22 at one end of the power supply cord 21 is grounded to the shielding case 31 through the ground terminal at the inlet socket of the electronic apparatus 30, the ground terminal 28 at the noise filter 24 also being grounded to the shielding case 31 of the electronic apparatus 30 through the shielding case 25 for the noise filter 24. Therefore, the cord 21 acts as an antenna for the noise generated at a frequency of $l = \frac{1}{2}\lambda$, but does not at all act as an antenna for noise having a frequency of $l = \frac{1}{4}\lambda$.

Accordingly, when l=30 cm, from $l=\frac{1}{2}\lambda$, $\lambda=60$ cm is obtained. Hence, for F=500 MHz, the wire acts as an antenna. From $l=\frac{1}{4}\lambda$, $\lambda=120$ cm is obtained. Hence, for f=250 MHz the wire does not act as an atenna. In brief, when the distance l is 30 cm, the power supply cord 21 cannot act as an radiation antenna for noise having a frequency in the range of about 250 to 300 MHz.

When the noise filter 24 mounted on the power supply cord 21 is to be mounted on the shielding case 31 of the electronic apparatus 30, it is desirable to simplify the mounting work by mounting the noise filter 24 on the power supply cord 21 at least 10 cm from one end thereof.

In addition, the power supply cord with the noise filter of the invention is not limited to the embodiment described above, but may of course be changed within the scope of the invention.

For example, the connector and the plug mounted on respective ends of the power supply cord may be approximately selected based on the use of power supply cord, or the connector and plug may not be used.

Figure 4:
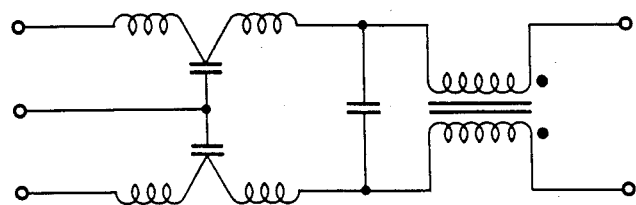
FIG. 4 is a modified equivalent circuit diagram of the noise filter.

The noise filter is not limited to the one described above, but may comprise a filter circuit unit comprising a circuit equivalent to the one shown in, for example, FIG. 4.

As seen from above, the power supply cord with the noise filter easily provides a countermeasure for noise, even for an electronic apparatus that does not have a noise filter, without requiring the especially troublesome application of wiring in the shielding case of the electronic apparatus. In other words, for example, the connector is mounted on one end of the power supply cord, said connector only being inserted into the socket provided at one surface of the electronic apparatus, thereby allowing a countermeasure for noise to be provided by performing simple mounting work.

Also, since the noise filter is mounted on the portion of the power supply cord within 30 cm from one end thereof connected to the noise generating source, the power supply cord does not act as a radiation antenna with respect to the noise band of the noise generating source, thereby eliminating the noise from both ends of the power supply cord while having a superior filter characteristic.

While a preferred embodiment of the invention has been described using specific terms, such description is for illustrative purpose only, and it is to be understood that changes and variations may be made without departing from the spirit or scope of the following claims.

We claim:

1. A power supply cord for connecting a noise generating source having an outer shielding case to a power source, said power supply cord having a connector at one end thereof operatively electrically connectable to the noise generating source, a plug at the other end thereof operatively electrically connectable to the power source, and a noise filter operatively electrically connected thereto at a predetermined distance from said one end thereof at which the supply power cord does not act as a radiation antenna for the noise generated by the noise generating source, said connector comprising an input terminal, an output terminal and a ground terminal, said plug comprising an input terminal, an output terminal and a ground terminal, and said noise filter comprising a shielding casing having means for facilitating a fixed mounting thereof to the outer periphery of the outer shielding case of the noise generating source, and a filter circuit within said shielding casing and operatively electrically connected to said input and said output terminals of said plug and said connector.

2. A power supply cord as claimed in claim 1, wherein said filter circuit also includes a ground terminal connected to said shielding casing.

3. A power supply cord as claimed in claim 1, wherein said predetermined distance is between 10 cm and 30 cm.

* * * * *